United States Patent [19]

Ye et al.

[11] Patent Number: 5,578,131
[45] Date of Patent: Nov. 26, 1996

[54] REDUCTION OF CONTAMINANT BUILDUP IN SEMICONDUCTOR PROCESSING APPARATUS

[76] Inventors: Yan Ye, 3862 Via Salice, Campbell, Calif. 95008; Anand Gupta, 1270 Briarcreek Ct., San Jose, Calif. 95131; Shamouil Shamouliam, 1256 Washoe Dr., San Jose, Calif. 95120

[21] Appl. No.: 459,197

[22] Filed: Jun. 2, 1995

Related U.S. Application Data

[62] Division of Ser. No. 138,528, Oct. 15, 1993.
[51] Int. Cl.$^6$ ................................................. C23C 16/00
[52] U.S. Cl. ....................... 118/723 R; 118/715; 156/345
[58] Field of Search ................................ 118/715, 723 R, 118/723 E; 156/345

[56] References Cited

U.S. PATENT DOCUMENTS

| | | | |
|---|---|---|---|
| 3,619,249 | 11/1971 | Cannon | 427/341 |
| 4,022,928 | 5/1977 | Piwcyzk | 427/43 |
| 5,244,730 | 9/1993 | Nguyen | 428/336 |

FOREIGN PATENT DOCUMENTS 140975  5/1985  Japan .

*Primary Examiner*—Richard Bueker
*Attorney, Agent, or Firm*—Robert W. Mulcahy; Raymond Kwong

[57] ABSTRACT

The present invention provides an apparatus for semiconductor processing in which the reactor chamber and the vacuum conduit means connected to the chamber are coated with a film of halogenated polymer material having a low vapor pressure and a low sticking coefficient. Preferred materials include low molecular weight polyfluoroethylene polymers such as polytetrafluoroethylene and polychlorotrifluoro-ethylene. A method is provided to prevent contaminant buildup on coated surfaces of semiconductor processing chambers and vacuum conduit means connected thereto during processing of a workpiece.

6 Claims, 1 Drawing Sheet

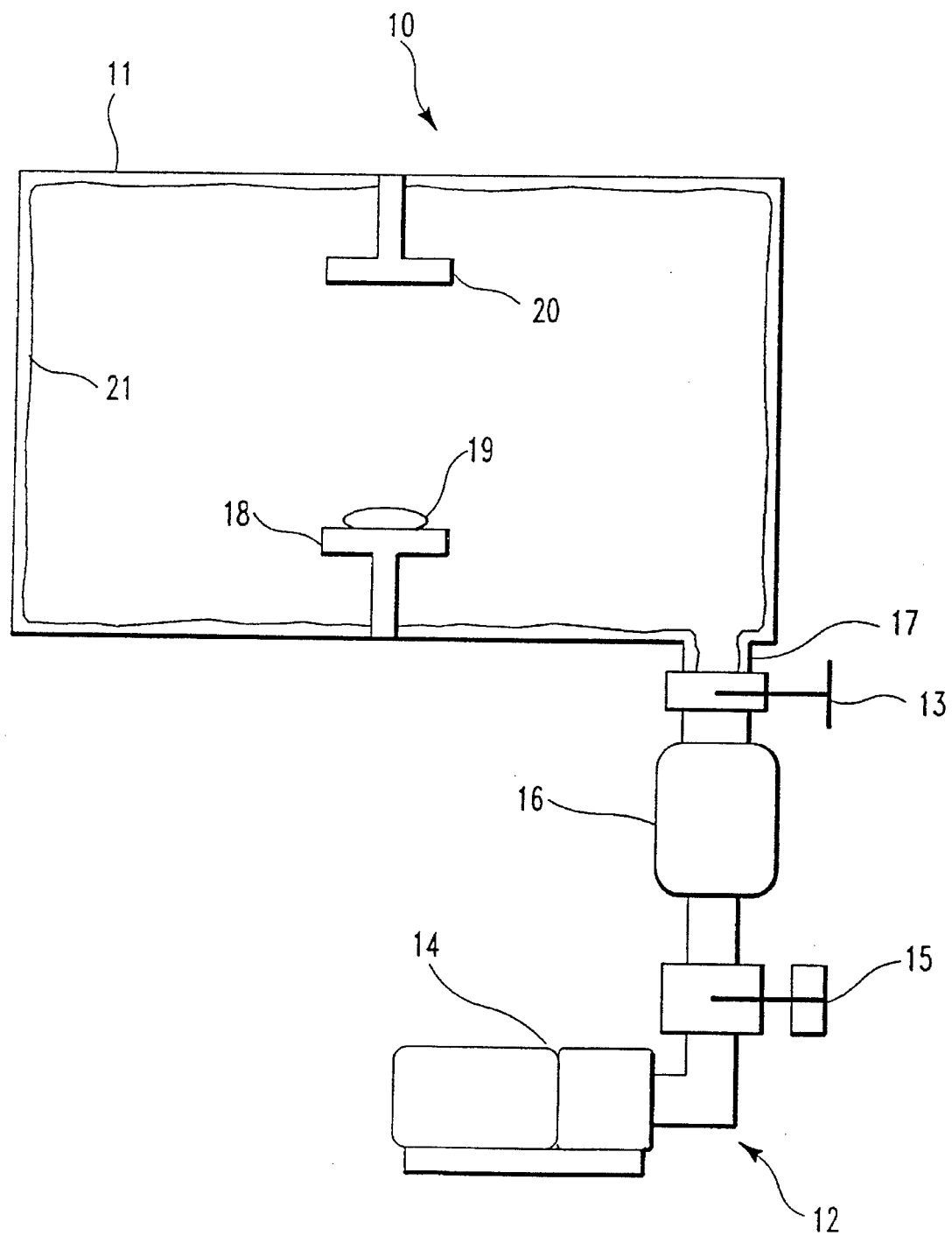

REDUCTION OF CONTAMINANT BUILDUP IN SEMICONDUCTOR PROCESSING APPARATUS

This application is a Divisional application of prior U.S. application Ser. No. 08/138,528 filed on Oct. 15, 1993.

FIELD OF THE INVENTION

The invention relates to novel halogenated polymer films or coatings for semiconductor processing systems which prevent by-product residue buildup during processing of a semiconductor workpiece. The present invention is directed to an apparatus and method for preventing the build up of by-product residues in semi-conductor process chambers and in the vacuum conductance channels through which vacuum is applied to the process chamber.

DESCRIPTION OF THE BACKGROUND ART

Semiconductor processing involves a number of different chemical and physical processes whereby minute integrated circuits are created on a substrate. The integrated circuits are constructed using multilayers of interrelated patterns of various materials, the layers being created by such processes as chemical vapor deposition (CVD), physical vapor deposition (PVD), and epitaxial growth. Some layers are patterned using photoresist masks and wet and dry etching techniques. Patterns are created within layers by the implantation of dopants at particular locations. The substrate upon which the integrated circuit is created may be silicon, gallium arsenide, glass, or other appropriate material.

Many of the processes carried out within semiconductor processing systems leave contaminant deposits on the walls of the process reactor chamber which accumulate and become the source of particulate matter harmful to the creation of a semiconductor device. As the geometries of semiconductor devices become ever so smaller, the ability to maintain the uniformity and accuracy of critical dimensions becomes strained. In this dimensional downsizing environment, the avoidance of contaminant particulate matter upon the surface of the semiconductor workpiece has become more critical.

In addition to the problem of workpiece contamination presented by the process generation and deposition of particulate contaminants on the semiconductor chamber wall, those contaminant particles escaping the chamber through the vacuum conductance system tend to deposit and accumulate on the inner walls of the vacuum conduit channel between the chamber and vacuum pump. The build-up of these particulate deposits will inevitably reduce or clog the vacuum flow conductance from the chamber and increase the speed of the pump to attempt maintenance of the minimum pressure of the chamber. And further, the buildup on the valves in the conduit channel cause their manipulative shut-off function to be negatively affected to a point where their use in regulating vacuum in the chamber is unpredictable and ineffective. To avoid problemsome residue accumulation in the vacuum system, regular and frequent cleaning of the vacuum conduit system would be necessary.

Particulate contamination buildup on semiconductor process chamber walls and vacuum conduit channels is particularly significant in the etch processing of semiconductor elements employing metal films. These metal films are generally etched by employing a number of reactive gases, including halocarbon gases, as plasma components. In the case of an aluminum film, the etchant gases used are predominantly the chlorine containing gases, chlorine ($Cl_2$) and boron trichloride ($BCl_3$), which enables formation of volatile aluminum chloride compounds upon etching, which volatile compounds can be removed from the etch processing chamber by applied vacuum. However, simultaneously with the formation of volatile aluminum chloride compounds, other active chlorine and boron containing species are formed which can react with any oxygen and water vapor present in the etch processing chamber or with organic species from patterning photoresist to form non volatile particulate compositions which ultimately produce relatively large quantities of contaminant on the inner walls of the process chamber. The non volatile particulate compositions initially tend to remain inside the etch chamber in the form of loosely attached particles to the chamber etch surfaces. These loosely attached etch by-product compounds can easily break free of the surface to which they are attached and fall upon a workpiece/substrate surface causing contamination of the workpiece surface, thereby resulting in a defective device. And, as indicated above, the build-up of etch contaminant on the vacuum conduit system will result in the diminished function or clogging of the vacuum source. As in the case of any semiconductor process system, the chamber and vacuum exhaust exits of the apparatus employed in metal etch must be cleaned periodically in order to avoid these problems and, of course, such cleaning requires shutdown of the plasma operation with consequent loss of production.

Known plasma chamber cleaning methods have involved opening the plasma etch chamber, disassembling portions of the chamber, and removing the contaminant deposits by physical of chemical methods. For example, the chamber can be rinsed with a solution of hydrochloric acid, or hand wiped with a solvent, to dissolve various contaminants. The etch chamber alternatively may be washed with water and dried. The same cleaning techniques are separately applied to the vacuum conductance channels and pump system to avoid the inevitable diminished vacuum or suffocation referred to above. All of these cleaning methods are complicated, disruptive, time consuming and can be sources of additional contamination.

Plasma enhanced dry cleaning processes exist whereby contaminants attached to the inside walls of a film deposition reaction chamber are removed by plasma etching using carbon tetrachloride and oxygen. However, presently known plasma enhanced dry cleaning systems require a dry cleaning time period equal to about 5% to 10% of the time spent in the aluminum etching process itself. Moreover, the dry cleaning plasma processes are generally ineffective with respect to the vacuum exhaust system which would have to be separately cleaned. It would clearly be advantageous to delay cleaning of plasma etch process chambers and the present invention effects such a result by providing the chamber and vacuum exhaust systems with a coating of a halogenated polymeric material having certain characteristics.

U.S. Pat. No. 5,087,727 to R. J. Steger, issued Feb. 4, 1992, discloses an improved plasma etching apparatus comprising an etch chamber having inner metal surfaces coated with a conductive coating capable of protecting such inner metal surfaces from chemical attack by reactant gases such as halogen-containing gases used in the chamber during the plasma etching process. In a preferred embodiment, a carbon coating having a thickness of at least about 0.2 micrometers is formed on the inner metal surfaces of the etch chamber by a plasma assisted CVD process using a gaseous source of carbon and either hydrogen or nitrogen or both.

U.S. Pat. No. 4,372,807 to Vossen et al., issued Feb. 8, 1983, discloses a process of plasma etching of aluminum in which the hydrocarbon gases, cyclopropane and ethylene, are added to the etchant gases and polymerized on the sidewalls of the etched aluminum to effect sidewall passivation thereby reducing undercutting and improving etch uniformity. The patent is silent as to any deposition of hydrocarbon polymer, or contaminant build-up, on the reactor walls.

U.S. Pat. No. 4,786,359 to Stark et al., issued Nov. 22, 1988, describes a plasma. etch process and apparatus in which silicon wafers are etched using a plasma assisted gas mixture comprising $CF_3Br$ and xenon or krypton. The patent teaches that the use of this halocarbon etchant gas results in polymer film deposition in the plasma reactor and cites such formation as a negative factor in the plasma etching process because of changes in the electrical characteristics of the reactor chamber and the presence of the polymer deposit as a source of particle contamination for the target wafer. The patent describes a means of preventing or eliminating buildup of the polymer by the use of oxygen in the etchant gas mixture and a sacrificial graphite ring.

All of the cited prior art describe the polymerization of an organic material under glow discharge conditions and deposition of a coating of polymer on the metallic sidewall of a workpiece and/or the plasma chamber walls. In one case, it is desired to deposit such a coating, which is used to aid device fabrication by assisting in the prevention of metal sidewall undercutting. In another case, a coating was intentionally deposited on the plasma etch chamber wall to protect the wall from corrosion by active species created during plasma glow processing. In still other cases, the polymer build up on etch chamber walls is a contaminant which must be periodically removed to prevent particulate flaking and device contamination.

In copending application to Shamouilian et al., Ser. No. 08/138,518, filed Oct. 15, 1993, and now abandoned, there is described a means of preventing the particulate flaking of plasma etch by-product buildup generated during metal etch processing, wherein organic materials are polymerized under glow discharge conditions and deposited as a coating on the contaminant laden surface of the chamber walls. The polymer coating entraps the contaminants and provides a fresh wall surface thereby extending the productive use time of the plasma processing chamber without the need for time consuming cleaning. However, even in the case of this improved contaminant control development, the layer of entrapped contaminants must be cleaned off the plasma processing chamber walls more frequently than contemplated with the use of the instant halogenated polymeric coatings.

It would be desirable to have a semiconductor processing apparatus and method of operation which prevents sticking or accommodation of semiconductor process residue buildup on the surface of the reactor chamber walls or the vacuum conduit channel means communicating with the chamber.

SUMMARY OF THE INVENTION

The present invention provides a semiconductor processing apparatus, and method of operating same, in which at least a portion of the processing apparatus reactor chamber and exhaust system interior surfaces are coated with a layer of a halogenated polymeric material which reduces process-generated by-product buildup on the coated surfaces. The invention extends the time period between cleaning necessary to maintain the semiconductor process reactor chamber and/or exhaust system (particularly the vacuum conduit) in satisfactory operating condition. The coating, typically comprised of particular halogenated polymeric materials, used according to the present invention, has a low sticking or accommodation coefficient and a low vapor pressure so the partial pressure contribution attributable to the coating under the semi-conductor processing conditions is minimal. The coating of the present invention is unaccommodating to by-products generated in semiconductor processing, so that the by-products do not stick to the coated surfaces; this prevents buildup of by-products in the semiconductor processing apparatus and helps reduce the amount of workpiece contamination attributable to the presence of such by-product.

The present invention is based on the discovery that particular halogenated organic polymers having the characteristics of a low sticking coefficient and a low vapor pressure can be used on the interior wall surfaces of semiconductor processing systems to prevent and control the amount of process by-product residue which builds up during semiconductor processing. Additionally these coatings can be applied in the form of thin films. The film-forming halogenated polymers employed herein have a sticking (or accommodation) coefficient of $10^{-4}$ or less and preferably contribute a partial pressure which is less than 1% of the total pressure at which the processing reactor chamber is operated, over the entire operational pressure range for the chamber. More particularly, certain low molecular weight halogenated polymers have been found to adhere to process apparatus surfaces and to exhibit the low sticking coefficient and low vapor pressure characteristics at coating thicknesses as low as 5 Angstroms (0.0005 μm). It was unexpected that coatings of this thickness would be sufficiently resistant to the ongoing chemical and/or physical attack which occurs during semiconductor processing to extend the time period between cleaning by a factor of at least 7. The average molecular weight of the halogenated polymers used to practice the present invention ranges from about 5,000 to about 800,000 and preferably from about 10,000 to 500,000. These halogenated polymers have been found to readily wet the metallic surfaces of semiconductor processing apparatus and form effective thin film coatings having thicknesses as low as 5 Angstroms(Å).

In operation, the semiconductor process reactor chamber and vacuum conductance subsystems coated with the instant halogenated polymers substantially reject the deposition of particulate by-products generated during semiconductor processing, thereby preventing the rapid accumulation or buildup of by-product residue on the chamber walls or the vacuum conductance subsystem surfaces. In this way the frequency of cleaning a residue laden semiconductor processing system can be reduced significantly thereby improving the overall efficiency of the processing of semiconductor workpieces.

The instant invention is directed to a semiconductor processing apparatus for processing workpieces comprising a chamber and an exhaust system through which reactor chamber gases are removed from the reaction chamber, the improvement comprising a coating of a low molecular weight polymeric material on the interior surfaces of at least a portion of the reactor chamber and/or exhaust system, wherein the coating exhibits a sticking coefficient of $10^{-4}$ or less and preferably contributes a partial pressure which is less than 1% of the total pressure at which the reaction chamber is operated, over the entire operational pressure range for the chamber.

The instant invention is further directed to a method of controlling by-product buildup during semiconductor processing of a workpiece comprising:

a) providing a semiconductor processing system comprised of a reactor chamber and an exhaust system through which reactor chamber gases are removed from the reaction chamber; and b) applying a layer of polymeric material to at least a portion of the interior surfaces of the reactor chamber and exhaust system, wherein the layer of polymeric material exhibits a sticking coefficient of $10^{-4}$ or less.

Preferably, the layer of polymeric material contributes a partial pressure to the reactor chamber which is 1% or less of the total chamber pressure.

BRIEF DESCRIPTION OF THE DRAWINGS

The sole FIGURE is a schematic of a vertical cross section of a simplified semiconductor processing apparatus which is used to indicate the various locations within the apparatus at which the polymeric coating or layer of the present invention is typically applied.

DETAILED DESCRIPTION OF THE INVENTION

The present invention provides a semiconductor processing apparatus in which the inner walls of the reactor chamber and/or vacuum conduit means are coated with low molecular weight polymers which polymer coatings have the characteristics of (1) a low sticking coefficient and (2) a low vapor pressure in a semiconductor reactor chamber environment. Additionally provided herein is a method for controlling residue build-up generated in the semiconductor processing of a workpiece in the instant uniquely coated semiconductor processing system. One preferred polymeric material is polychlorotrifluoroethylene ($-CF_2CFCl-$)$_n$. This halogenated polymer coating has a low sticking (or accommodation) coefficient, and consequently a high surface lubricity, which causes rejection or non accumulation of particulate contaminants generated in the semiconductor process. Additionally, a film (20 μm or less) of this halogenated polymer on at least portions of the interior surfaces of the reaction chamber and exhaust system components has been found, under commonly-used semiconductor processing conditions, to contribute a partial vapor pressure ($P_{v1}$) of less than 1% of the total vapor pressure ($P_o$) within the reaction chamber. This low partial vapor pressure ensures that the coating or layer of material will not be a source of contaminant for the workpiece being processed in the reaction chamber.

While the film forming nature of the instantly disclosed organic polymers has been generally known, it has not heretofore been recognized or appreciated that (1) these organic halogenated polymers could be effectively used in semiconductor processing environments; (2) that they would effectively adhere to and form a coating on the surface walls of a semiconductor processing system; and (3) that the coatings formed would have the surface characteristics which would help prevent the formation and build up of contaminant residues on process chamber surfaces during the treatment of semiconductor workpieces.

As indicated, the present invention is directed to the use of coatings of certain polymeric materials in semiconductor processing apparatuses to achieve contamination control during plasma processing of semiconductor workpieces. The polymeric materials disclosed and employed herein are halogenated polymers capable of forming coatings or thin films having a sticking (or mass accommodation) coefficient of $10^{-4}$ or less and which contribute a partial pressure ($P_{v1}$) within the reactor chamber which is less than 1% of the total reactor chamber pressure, over the entire operational pressure range for the reactor chamber. The present invention has been utilized particularly in semiconductor etch processing, wherein contaminant particulate residue buildup is a significant problem. Such etch processing is typically carried out at temperatures ranging from about 20° C. to about 100° C. When the semiconductor processing is to be carried out at higher temperatures, one skilled in the art can adjust the molecular weight of the halogenated polymers as necessary to accommodate the temperature increase without a significant increase in the partial pressure contribution of the coating.

As used herein the terms "sticking coefficient" or "mass accommodation coefficient", designated as α, refers to the probability that a by-product particle, molecular cluster, or reactive species generated in a semiconductor process will strike and adhere to the inner coated wall surface of a semiconductor processing system of the present invention. α is a measure of the ratio of semiconductor by-product particles, molecular clusters, or reactive species striking the coated surface to those particles or molecules remaining on the coated surface, a unitary value of one (1) being a 100% stick of all particles or molecules impacting the coated surface. The sticking coefficient of $10^{-4}$ for the instant coating materials means that only one in ten thousand semiconductor process by-product particles or molecules will deposit and adhere to the internal surfaces of the semiconductor processing system coated with these materials.

The sticking (or mass accommodation) coefficient, α, of the halogenated polymer coatings herein can be measured and calculated by techniques known in the art. As one example of a laminar flow tubular penetration technique, measured samples of plasma etch by-product residue are powdered into particles. These by-product particles are then entrained in a nitrogen gas flow and passed through a 1.2 m long flow tube with an internal diameter of 75 mm and coated with a polychlorotrifluoroethylene halocarbon wax of the present invention. Measurements are then made of the particles passing through the tube and the sticking coefficient is then calculated from the differential of the amount of incoming and exiting particles. Techniques for measurement of α, the mass accommodation or sticking coefficient, according to laminar flow processes are outlined in "Mass Accommodation Coefficient for HO$_2$ Radicals on Aqueous Particles", Mozurkewich et al., JOURNAL OF GEOPHYSICAL RESEARCH, Vol 92, No. D4, Pages 4163–4170, Apr. 20, 1987. Laminar flow measurements and calculations are disclosed and taught in "Mass Accommodation Coefficients from Penetration Measurements in Laminar Tube Flow", P. H.. M$_c$ Murry et al., ATMOSPHERIC ENVIRONMENT, Vol 21, No.5, pp 1231–1234 (1987). Other techniques of measuring sticking coefficients are included in U.S. Pat. No. 5,210,051 to Calvin H. Carter, issued May 11, 1993, hereby incorporated by reference.

The vapor pressure of the instant polymeric materials must be low enough so as to not constitute a significant compositional part of the semiconductor processing environment and thereby avoid contaminant deposition of this polymer on a processed workpiece. It has been found that non-contaminating polymeric films will have a partial vapor pressure ($P_{v1}$) not exceeding 1% of the total vapor pressure ($P_o$) of all materials contributing to the semiconductor processing chamber environment, i.e.

$$P_o = P_{v1} + P_{v2} + P_{v3} \cdots + P_{vz},$$

where these partial vapor pressures are calculated at a standard semiconductor reactor chamber operating temperatures of from 20° C. to 100° C. and pressures of 100 to 800 milliTorr (mt). It was the discovery that materials having the instantly disclosed sticking coefficient and vapor pressure characteristics could be effective in a semi-conductor reactor environment that enabled the present invention.

As used herein "film" means a layer of material on a semiconductor processing system interior wall, having a thickness of about 30 micrometers (μm) (300,000 Å) or less and a uniformity within 20% of its average value. A "thin" film as used herein means a film having a thickness of less than about 20,000 angstroms (Å), and preferably ranging from about 10 to 2000 angstroms (Å). While films of greater thicknesses can be employed, such thicker films will more likely erode in a semiconductor processing environment employing a plasma, thereby forming contaminants. Further, thicker films may electrically insulate the plasma chamber walls thereby disturbing the power variable in the plasma process.

While any and all organic low molecular weight polymer coatings having the required "non-stick" and low vapor pressure characteristics can be used in the practice of the present invention, preferred polymer compositions include any halogenated polymers. Especially preferred are fluorocarbon polymers which include polytetrafluoroethylene ($-CF_2CF_2-$)$_n$, polychlorotrifluoroethylene ($-CF_2CFCl-$)$_n$ and copolymers thereof. As used herein, the polyfluoroethylene polymers, "polytetrafluoroethylene" and "polychlorotrifluoroethylene", include not only the homopolymers of these fluorocarbon polymers but any copolymers of tetrafluoroethylene or chlorotrifluoroethylene and unsaturated comonomers which copolymers have the sticking and vapor pressure characteristics to be practiced in the present invention. Examples include tetrafluoroethylene or chlorotrifluoroethylene copolymerized with one another or each with an alpha olefin such as ethylene or propylene, fluorinated olefins such as hexafluoropropylene, or vinyl ethers such as perfluoro alkyl vinyl ether. The preferred fluorocarbon polymers of the present invention have low molecular weights of about 5,000 to about 800,000, the optimum molecular weight for practice of the present invention being between about 10,000 to 500,000.

The most preferred fluoropolymers used within the purview of the present invention are the low molecular weight polymers of polychlorotrifluoroethylene ($-CF_2CFCl-$)$_n$. The low molecular weight polymers and copolymers of polychlorotri-fluoroethylene are preferably completely saturated so as to render them molecularly strong and plasma resistant for use in plasma chambers. These low molecular weight polychlorotrifluoroethylene polymers are in the form of oils and waxes which are separated into various fractions by vacuum distillation. The halogenated polyethylene oils of these polymers increase in viscosity and density as the average molecular weights of the fractions increase. As the molecular weight increases further the polychloro-trifluoroethylene polymers change from oils to waxes. The polychlorotrifluoroethylene waxes used in the practice of the instant invention are all white solids at room temperature with initial boiling points above 500° F. (260° C.) and densities ranging from about 1.80 to 1.95 g/ml with the most preferred being about 1.89 g/ml at 210° F. (99° C.).

Greases may be made from the polyfluoroethylene oils of the present invention by the incorporation of gelling agents such as a higher molecular weight polyfluoro-ethylene to form grease structures. The properties of the halogenated polyethylene greases depend on how heavily they are gelled. The content of the low molecular weight polyfluoroethylene in a grease composition to be employed in the practice of the instant invention is from about 0.5 to 60% by weight based on the weight of the total composition. When the content of the low molecular weight polyfluoroethylene is less than 0.5% by weight, the dropping point of the grease composition is too low and oil separation is too large to be used in a high temperature or hostile semiconductor processing environments such as plasma chambers. Moreover, the viscosity of the grease composition varies with temperature change. When the content is larger than 60% by weight, the grease composition becomes so hard that its preparation is difficult and its distribution property is deteriorated.

Polychlorotrifluoroethylene oils used in the practice of the invention have a high density of about twice that of water and means that the viscosity in centipoises is about twice the centistoke value; in conventional fluids centistoke and centipoise values are usually similar or the centipoise value is the lower one. Polychlorotrifluoroethylene oils have low surface tensions because of their chemical composition. The low values of 23–30 dynes/cm result in their easy wetting of most materials which is helpful in the lubricity necessary for the semiconductor processing apparatus coatings of the instant invention. These characteristics enable polychlorotrifluoroethylene oil to be directly applied to the semiconductor processing chamber or vacuum conductance conduits without the use of solvents to form thin uniform layers of polymer throughout the applied areas.

The low molecular weight halogenated polymer oil, grease or wax can be use directly to apply a coating to a semiconductor reactor chamber and the vacuum conduit system of a semiconductor processing apparatus. In the case of the soft grease or oil, a coating of halogenated polymer can be applied to the chamber by hand or other direct physical application. Alternatively, the grease, oil or wax can be dissolved in a solvent and a film deposited on the inner walls of the chamber and/or the vacuum conduit means by dip, spray or east coating. The low molecular weight halogenated polyethylenes of this invention are soluble in most organic liquids including acetone, benzene, carbon tetrachloride, chloroform, ethanol, ethyl ether, hexane, kerosene, methyl ethyl ketone and other readily available solvents. When used herein, the solvent coating techniques can achieve film thicknesses of less than 30 micrometers (μm) down to about 1 μm (10,000 Å).

To achieve thin films of halogenated polymer on the semiconductor processing apparatus of the present invention, it is necessary to employ thin film techniques presently known in the art. For example, plasma assisted chemical vapor deposition ("plasma CVD") can be used to achieve thin fills approaching molecular thicknesses as low as 5 angstroms (Å). Such plasma CVD processes and techniques are well known and disclosed in the prior art as in U.S. Pat. No. 5,085,727 to Robert J. Steger (issued on Feb. 4, 1992) and U.S. Pat. No. 5,002,794 to Buddy D. Ratner (issued on Mar. 26, 1991), both hereby incorporated by reference.

One of the more important properties of the instant low molecular weight halogenated polyethylene plasma apparatus coatings is their chemical inertness. These polymers are inert because of their relatively complete saturation (the virtually complete absence of double bonds in the polymer chain) and absence of hydrogen. Another important property is the thermal stability of the low molecular weight halogenated polyethylene oils which extends up to the decomposition temperatures of the carbon chain. These halogenated polyethylenes are non corrosive towards metals at temperatures up to about 350° F. (177° C.) with the exception of copper and its alloys. Additionally, the heats of vaporization for the instant halogenated polyethylenes vary from 20 to about 30 cal/gram which render them sufficient for use in the hostile semiconductor processing environment such as plasma. The most important characteristic of the instant halogenated polyethylenes is their ability to wet metallic surfaces and form lubricating films. This feature enables the coating of a semiconductor processing apparatus with the preferred polymer, polychlorotrifluoroethylene, to avoid, and thereby control, undesirable buildup of contaminants and residues ordinarily expected in such processes.

All of the preferred polyfluoroethylene polymers, the low molecular weight polychlorotrifluoropolyethylenes, used in the practice of the present invention are available from Halocarbon Products Corporation of Hackansack, N.J.

Turning to the sole FIGURE, there is demonstrated, in simplified form, a semiconductor processing system 10 in the form of a plasma apparatus comprised of a chamber 11 and a vacuum exhaust system 12 which is comprised of a shut off gate valve 13, a mechanical vacuum pump 14, a vacuum pump isolation valve 15, and a turbo vacuum pump 16 to achieve the very low vacuum required in semiconductor processing. Additionally shown is exit vacuum conduit linkage 17. The chamber 11 further comprises a cathode pedestal 18 on which is seated a semiconductor workpiece 19 and an anode 20, both electrodes being powered by an RF power supply (not shown). The chamber 11 and part of the vacuum system, the exit vacuum conduit pipe 17, are coated with a polychlorotrifluoroethylene wax 21 to control residues from the workpiece 19 which is to be coated or etched in the plasma process. For example, in an etching process of an aluminum film workpiece 19, RF power is applied between cathode 19 and anode 20 creating a plasma which reacts with the aluminum film to create particulate residues which swirl about the chamber. The polychlorotrifluoroethylene lubricant coating 21 "wets" these particles and releases them back to the swirling atmosphere where they exit through the vacuum conductance conduit system 12 at the vacuum exit or exhaust pipe 17 which is also coated with the polyfluoro-ethylene film 21 to prevent etch by-product buildup at this upper channel of the vacuum exhaust system 12. In the absence of the polychlorotrifluoroethylene coating the particulate contaminants would likely accumulate as an unstable flaky coating on the inner surface of the chamber and flake off in relatively large quantities and migrate back to the workpiece 19 thereby contaminating it. Moreover, escaping particles from the chamber could accumulate in the exhaust system 12 and cause either suffocation or inhibit vacuum conductance throughout the chamber.

In accordance with the present invention, a coating 21 of a lubricant low molecular weight polyfluoroethylene polymer is formed on the inner wall of chamber 11 and on the exit vacuum conduit surface 17 of vacuum exhaust system 12. While not shown, the coating 21 may optionally, and preferably, extend down through the vacuum conduit channel and on into the vacuum pump 14. This coating 21 of halogenated polymeric material can be in the low molecular weight form of an oil, wax or can be prepared as a grease. In any form, the instant coatings of polyfluoroethylene polymers have superior lubricant and low sticking coefficient characteristics to prevent accumulation of plasma generated residues. The instant coatings have sufficient adherence to the metallic walls of chamber 11 to provide uniform and effective films.

EXAMPLES

The following examples demonstrate the capabilities of the low molecular weight polychlorotrifluoroethylene as a contaminant control film on the inner walls of a plasma chamber in the practice of the present invention.

Example 1

In actual practice of the present polychlorotrifluoroethylene film coated plasma apparatus shown in FIG. 1, there is provided a chamber the inner walls of which have been sprayed with a solution of Halocarbon Wax, produced by the Halocarbon Products Corporation, and acetone to provide a 20 μm layer 21 of the wax all about the chamber. The exhaust exit pipe 17 leading from the chamber to the gate valve 13 and turbo vacuum pump 16 as shown in FIG. 1 is also spray coated with a 20 μm coating 21 of the halogenated polymer. Additionally provided to the coated chamber is a workpiece 19 comprised of a silicon wafer overlaid with an aluminum film layer which is further overlaid with a layer of patterned photoresist comprised of a phenol formaldehyde novalak resin with a diazoquinone sensitizer.

An etch plasma is formed in the coated chamber utilizing $Bcl_3$, $Cl_2$, and $N_2$ gases each flowing at approximately 50 sccm. The power applied ranges between 500 to 800 W, the process chamber pressure ranges from about 200 to 600 mt; the operational workpiece temperature is about 70° C.; and the chamber wall temperature is maintained at 65° C. The power is applied for ten minutes and thereafter there is observed that the film coating 21 of polychlorotrifluoroethylene is relatively clean, demonstrating little accumulation of particulate aluminum residue buildup. The same clean results are observed in the vacuum conduit pipe shown as 17 in FIG. 1.

Example 2

Etching of the workpiece of Example 1 is repeated except that the chamber and vacuum conduit pipe film is a 30 μm thick dip coating 21 of the halocarbon grease of Halocarbon Products Corporation designated as 25-10M instead of the halogenated wax polymer of Example 1. The etch is carried out in substantially the same manner, the total flow of the gases being 150 sccm; the power density applied being 400 W; the process chamber pressure being 500 mt; and the operational workpiece temperature being 80° C., the chamber wall being maintained at 65° C. Etching was carried out for 12 minutes resulting in an observation that the grease appeared relatively untouched by the etch process.

The above experimental data indicates that employing the halogenated polymers of the present invention will result in an improved semiconductor reactor chamber and exhaust system (principally vacuum conduit system) in that the halogenated polymer coating will more effectively prevent residue buildup in semiconductor processing apparatus so that the apparatus requires cleaning far less often. For example, a cleaning which had been required after 2 or 3 days of operation was required only after 2 to 3 weeks of operation when the present invention was practiced.

Having described the invention, it will be apparent to those skilled in the art that various modifications can be made within the scope of the present invention. For example, the process configuration of the figure is exemplary as to plasma systems and other semiconductor processing systems and chambers can employ the coating of the present invention.

We claim:

1. A method of controlling by-product buildup on the interior surfaces of a semiconductor plasma processing apparatus during processing of a workpiece, comprising:

a) providing a semiconductor plasma processing apparatus comprised of a reactor chamber and an exhaust system through which reactor chamber gases are removed from said reaction chamber; and b) applying a layer of polyfluoroethylene polymer selected from the group consisting of polytetrafluoroethylene ($—CF_2CF_2—)_n$, polychlorotrifluoroethylene ($—CF_2CFCl—)_n$ and copolymers of tetrafluoroethylene and chlorotrifluoroethylene, said polyfluoroethylene polymer being in the form of an oil, grease or wax, to at least a portion of the interior surfaces of said reactor chamber and said exhaust system, wherein said layer of polymeric material exhibits a sticking coefficient of $10^{-4}$ or less and contributes a partial pressure which is 1% or less of the total vapor pressure over the entire operational pressure range for said chamber.

2. The method of claim 1 in which said polyfluoroethylene polymer has a molecular weight in the range of from about 5,000 to 800,000.

3. The method of claim 1 in which said layer of polymeric material is comprised of a copolymer of polyfluoroethylene with at least one comonomer selected from the group consisting of alpha olefins, fluorinated olefins, and vinyl ethers.

4. The method of claim 1 in which said layer has a thickness of 300,000 Angstroms (30 μm) or less.

5. The method of claim 1 in which said polyfluoroethylene is polychlorotrifluoroethylene.

6. The method of claim 5 in which said polychlorotrifluoroethylene has a molecular weight ranging from about 10,000 to 500,000 and said layer exhibits a thicknesses ranging from about 5 Angstroms (0.0005 μm) to about 20,000 Angstroms (2 μm).

* * * * *